(12) United States Patent
Jung

(10) Patent No.: US 9,825,024 B2
(45) Date of Patent: Nov. 21, 2017

(54) SEMICONDUCTOR DEVICE

(71) Applicant: SAMSUNG ELECTRONICS CO., LTD., Suwon-si, Gyeonggi-do (KR)

(72) Inventor: Jong-Hoon Jung, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/870,141

(22) Filed: Sep. 30, 2015

(65) Prior Publication Data

US 2017/0092638 A1 Mar. 30, 2017

(51) Int. Cl.
*H01L 27/02* (2006.01)
*H01L 27/11* (2006.01)
*H01L 29/78* (2006.01)
*H01L 23/528* (2006.01)
*H01L 27/108* (2006.01)

(52) U.S. Cl.
CPC ........ *H01L 27/0292* (2013.01); *H01L 23/528* (2013.01); *H01L 27/10897* (2013.01); *H01L 27/1116* (2013.01); *H01L 29/78* (2013.01)

(58) Field of Classification Search
CPC ................................................. H01L 27/0292
USPC ......................................................... 257/401
See application file for complete search history.

(56) References Cited

U.S. PATENT DOCUMENTS

| 6,570,195 | B2 | 5/2003 | Brunolli et al. |
| 7,884,424 | B2 | 2/2011 | Kim |
| 8,237,203 | B2 | 8/2012 | Tsuda et al. |
| 8,264,011 | B2 | 9/2012 | Tsuda |
| 2011/0097895 | A1* | 4/2011 | Hong ............... H01L 21/76816 438/627 |
| 2012/0228714 | A1* | 9/2012 | Lim ..................... H01L 27/1104 257/369 |
| 2013/0049215 | A1 | 2/2013 | Larsen |
| 2014/0159158 | A1* | 6/2014 | Kim ...................... H01L 27/088 257/368 |
| 2015/0069523 | A1* | 3/2015 | Or-Bach ............. H01L 25/0657 257/390 |

FOREIGN PATENT DOCUMENTS

| JP | 10-173055 | 6/1998 |
| JP | 11-003983 | 1/1999 |
| JP | 2000-277620 | 10/2000 |

* cited by examiner

*Primary Examiner* — Moazzam Hossain
*Assistant Examiner* — Omar Mojaddedi
(74) *Attorney, Agent, or Firm* — F. Chau & Associates, LLC

(57) ABSTRACT

A semiconductor device is provided. The semiconductor device includes an active region, a gate line, a first metal interconnect, a power rail, and a second metal interconnect. The gate line overlaps the active region and extends along a first direction. The first metal interconnect overlaps the active region and the gate line. The first metal interconnect extends along a second direction intersecting the first direction. The power rail is disposed in a higher layer than the first metal interconnect. The power rail extends along the second direction. The second metal interconnect is disposed in a same layer as the power rail, the second metal interconnect extends along the second direction.

16 Claims, 19 Drawing Sheets

<u>8</u>

1200

1300

1400

SEMICONDUCTOR DEVICE

TECHNICAL FIELD

The present inventive concept relates to a semiconductor device, and more particularly, to a semiconductor device with design to reduce short circuits.

DISCUSSION OF THE RELATED ART

In semiconductor design, a logic cell (e.g., a standard cell) that provides a Boolean logic function or a storage function may be pre-designed and may be used for semiconductor integrated circuit (IC) design.

As density of semiconductor devices increases, design rules are decreased, but probability of short circuits also increases.

SUMMARY

According to an exemplary embodiment of the present inventive concept, a semiconductor device is provided. The semiconductor device includes an active region, a gate line, a first metal interconnect, a power rail, and a second metal interconnect. The gate line overlaps the active region and extends along a first direction. The first metal interconnect overlaps the active region and the gate line. The first metal interconnect extends along a second direction intersecting the first direction. The power rail is disposed in a higher layer than the first metal interconnect. The power rail extends along the second direction. The second metal interconnect is disposed in a same layer as the power rail, the second metal interconnect extends along the second direction.

The gate line may be disposed in a first layer. The first metal interconnect may be disposed in a second layer. The second metal interconnect may be disposed in a third layer. The second layer may be disposed on the first layer. The third layer may be disposed on the second layer.

At least one of the first metal interconnect and the second metal interconnect may include copper.

The power rail may overlap an end of the gate line.

A first distance between the second metal interconnect and the power rail in the first direction may be smaller than a second distance between the first metal interconnect and the power rail in the first direction.

The first metal interconnect may include a plurality of metal interconnects. The plurality of metal interconnects may be separated from the power rail in the first direction by a distance greater than the first distance.

The active region may include a first active region and a second active region separated from the first active region in the first direction. A gate pickup region may be disposed between the first active region and the second active region.

The gate line may include a first gate part which overlaps the first active region, a second gate part which overlaps the gate pickup region, and a third gate part which overlaps the second active region.

The first metal interconnect may include a plurality of metal interconnects. At least one of the plurality of metal interconnects may overlap the second gate part.

The first to third gate parts may be formed with each other in an integrated manner.

The semiconductor device may further include a first contact formed on the active region. The first contact may overlap the second metal interconnect. The first contact may be disposed in a lower layer than the second metal interconnect.

The semiconductor device may further include a second contact formed on the gate line. The second contact may be disposed in a lower layer than the second metal interconnect.

The first contact and the second contact may be disposed in a same layer as each other.

The first metal interconnect may include tungsten, and the second metal interconnect may include copper.

The active region may include a fin which protrudes upward from a substrate.

According to an exemplary embodiment of the present inventive concept, a semiconductor device is provided. The semiconductor device includes a first layer, a second layer, a first metal interconnect, a third layer, a second metal interconnect, and a power rail. The first layer includes an active region. The second layer is disposed on the first layer. The first metal interconnect is formed in the second layer. The first metal interconnect overlaps the active region. The third layer is disposed on the second layer. The second metal interconnect is formed in the third layer. The second metal interconnect overlaps the active region. The second metal interconnect does not overlap the first metal interconnect. The power rail is formed in the third layer. The power rail does not overlap the active region. The power rail is electrically connected to the second metal interconnect to supply power to the second metal interconnect.

The semiconductor device may further include a gate line formed in the first layer.

The semiconductor device may further include a first contact formed on the active region and a second contact formed on the gate line.

The first and second contacts may be formed in the second layer.

The first metal interconnect may include tungsten.

The second metal interconnect may include copper.

A first distance between the second metal interconnect and the power rail may be smaller than a second distance between the first metal interconnect and the power rail.

According to an exemplary embodiment of the present inventive concept, a semiconductor device is provided. The semiconductor device includes a first active region, a second active region, a gate pickup region, first and second gate lines, a power rail, a first metal interconnect, and a second metal interconnect. The second active region is separated from the first active region. The gate pickup region is disposed between the first active region and the second active region. The first and second gate lines overlap the first active region, the second active region, and the gate pickup region. The first and second gate lines are separated from each other. The power rail overlaps an end of each of the first and second gate lines. The first metal interconnect may be disposed on the gate pickup region. The first metal interconnect electrically connects the first gate line and the second gate line. The second metal interconnect is disposed closer to the power rail than the first metal interconnect. The second metal interconnect is disposed in a higher layer than the first metal interconnect.

The first and second gate lines may be disposed in a first layer. The first metal interconnect may be disposed in a second layer. The second metal interconnect may be disposed in a third layer. The second layer may be disposed on the first layer. The third layer may be disposed on the second layer.

At least one of the first and second metal interconnects may include copper.

The semiconductor device may further include a first contact formed on the first active region. The first contact may overlap the second metal interconnect. The first contact may be disposed in a lower layer than the second metal interconnect.

The semiconductor device may further include a second contact formed on the first gate line. The second contact may be disposed in a lower layer than the second metal interconnect.

The first contact and the second contact may be disposed in a same layer as each other.

The first metal interconnect may include tungsten, and the second metal interconnect may include copper.

The first active region may include a first fin which protrudes upward from a substrate.

According to an exemplary embodiment of the present inventive concept, a semiconductor device is provided. The semiconductor device includes an active region, first and second fins, a gate insulating layer, a gate line, a first metal interconnect, a power rail, and a second metal interconnect. Each of the first fin and the second fin protrudes from the active region. The gate insulating layer is formed on the first and second fins. The gate line is formed on the gate insulating layer. The first metal interconnect overlaps the active region and the gate line. The first metal interconnect is disposed in a first layer. The power rail is disposed in a second layer different from the first layer. The second metal interconnect is disposed in the second layer.

The second layer may be disposed on the first layer.

At least one of the first metal interconnect and the second metal interconnect may include copper.

The second metal interconnect may be disposed closer to the power rail than the first metal interconnect.

The power rail may be electrically connected to the second metal interconnect.

BRIEF DESCRIPTION OF THE DRAWINGS

The above and other features of the present inventive concept will become more apparent by describing in detail exemplary embodiments thereof with reference to the attached drawings, in which.

DETAILED DESCRIPTION OF THE EMBODIMENTS

The present inventive concept will now be described more fully hereinafter with reference to the accompanying drawings, in which embodiments of the present inventive concept are shown. The present inventive concept may, however, be embodied in different forms without departing from the spirit and scope of the present inventive concept and should not be construed as limited to the embodiments set forth herein. The same reference numbers may indicate the same elements throughout the specification and drawings. In the attached figures, the thickness of layers and regions may be exaggerated for clarity.

As used herein, the term "and/or" includes any and all combinations of one or more of the associated listed items and may be abbreviated as "/".

As used herein, the singular terms "a", "an", and "the" and similar referents in the context of describing the invention (especially in the context of the following claims) are to be construed to cover both the singular and the plural forms, unless the context clearly indicates otherwise.

As the design of semiconductor integrated circuits (ICs) becomes complicated, an automatic design method (e.g, a semi-custom design method) using a computer may be used. In the semi-custom design method, a desired circuit may be developed by using pre-designed standard basic circuits (e.g., logic cells). The logic cells may be automatically designed using a computer. The semi-custom design method includes a standard cell design method in which a circuit is designed using a plurality of standard cells.

In the standard cell design method, a complicated logic circuit formed by combining basic circuits is pre-designed and registered in a database of a computer as a standard cell. When a semiconductor integrated circuit (IC) is designed, various standard cells which have been registered in the database are combined to produce a desired circuit. For example, the standard cells are uniform in height, and a semiconductor IC is designed by arranging the standard cells in a plurality of columns or rows.

By reducing the size of transistors in standard cell, the size of each standard cell may be reduced.

If a standard cell layout according to an exemplary embodiment of the present inventive concept is employed to design a semiconductor IC, the standard cell size can be reduced, a plurality of gates included in the standard cell can be simultaneously picked up, and a plurality of pins in the standard cell can be accessible. Further, a first metal (e.g., a sixth metal interconnect 201 of FIG. 3) adjacent to a power rail and a second metal (e.g., a first metal interconnect 111 of FIG. 3) connected to an active region are formed in different layers from each other, and thus, a track loss and a short circuit in patterns may be prevented.

Figure 1:
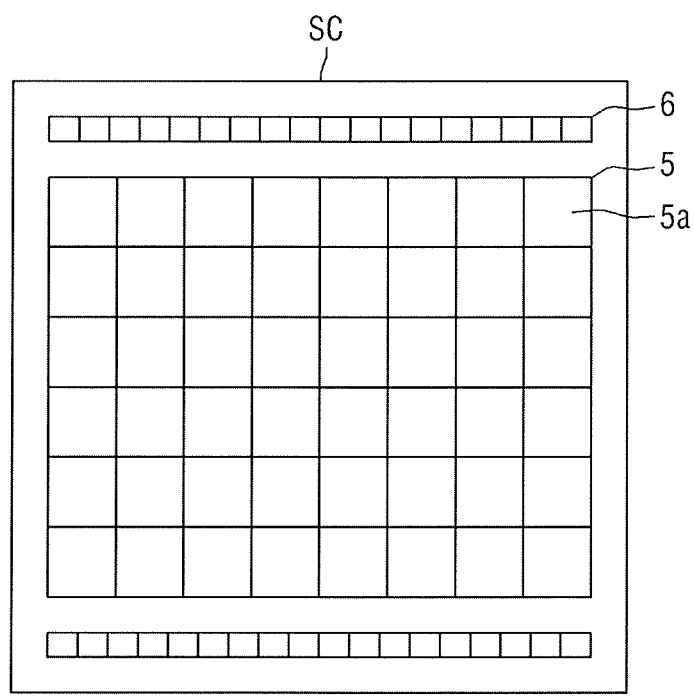
FIG. 1 is a layout view of a semiconductor chip including a plurality of standard cells according to an exemplary embodiment of the present inventive concept.
Figure 2:
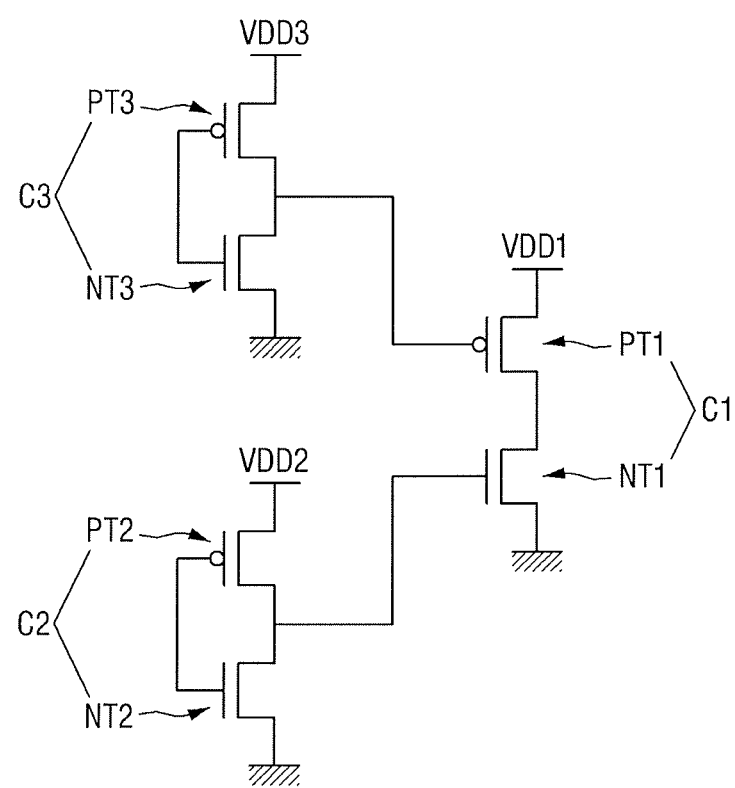
FIG. 2 is a circuit diagram illustrating the operation of a single standard cell according to an exemplary embodiment of the present inventive concept.

FIG. 1 is a layout view of a semiconductor chip SC including a plurality of standard cells 5a according to an exemplary embodiment of the present inventive concept. FIG. 2 is a circuit diagram illustrating the operation of a single standard cell according to an exemplary embodiment of the present inventive concept.

Referring to FIG. 1, a standard cell region 5 and an input/output cell region 6 may be defined in a surface of the semiconductor chip SC, and the standard cell region 5 may include the plurality of standard cells 5a. The standard cell region 5 may be formed in the surface of the semiconductor chip SC. Pads may be formed in the input/output cell region 6. Signals may be received from an external source and may be output to an external destination through the pads. The input/output cell region 6 may be disposed around the standard cell region 5.

The standard cells 5a may be arranged in the standard cell region 5 in a matrix pattern. A system-on-chip (SOC) may use a standard cell library. A central processing unit (CPU), a random access memory (RAM), first-in first-out (FIFO), small computer system interface (SCSI), sea of gates (SOG), etc. may be formed in the standard cell region 5.

An exemplary circuit formed in each of the standard cells 5a will now be described with reference to FIG. 2. In FIG. 2, a partial circuit of a buffer formed in a standard cell 5a is illustrated as an example. The partial circuit includes an output terminal and a driver. The output terminal may include a first complementary metal oxide semiconductor (CMOS) inverter C1 which includes a first p-channel metal oxide semiconductor (PMOS) transistor PT1 and a first n-channel metal oxide semiconductor (NMOS) transistor NT1. The driver may include a second CMOS inverter C2 and a third CMOS inverter C3. The second CMOS inverter C2 includes a second PMOS transistor PT2 and a second NMOS transistor NT2. The third CMOS inverter C3 includes a third PMOS transistor PT3 and a third NMOS transistor NT3.

An output signal of the second CMOS inverter C2 may be input to an input terminal of the first NMOS transistor NT1, and an output signal of the third CMOS inverter C3 may be input to an input terminal of the first PMOS transistor PT1.

Referring to FIG. 2, when a high-level signal is input to input terminals of the third CMOS inverter C3 and the second CMOS inverter C2, the first CMOS inverter C1 outputs a high-level signal through an output terminal. When a low-level signal is input to the input terminals of the third CMOS inverter C3 and the second CMOS inverter C2, the first CMOS inverter C1 outputs a low-level signal through the output terminal.

In addition, when a low-level signal is input to the input terminal of the third CMOS inverter C3 and a high-level signal is input to the input terminal of the second CMOS inverter C2, the first CMOS inverter C1 may be in a floating state (e.g., in a high-impedance state).

Figure 3:
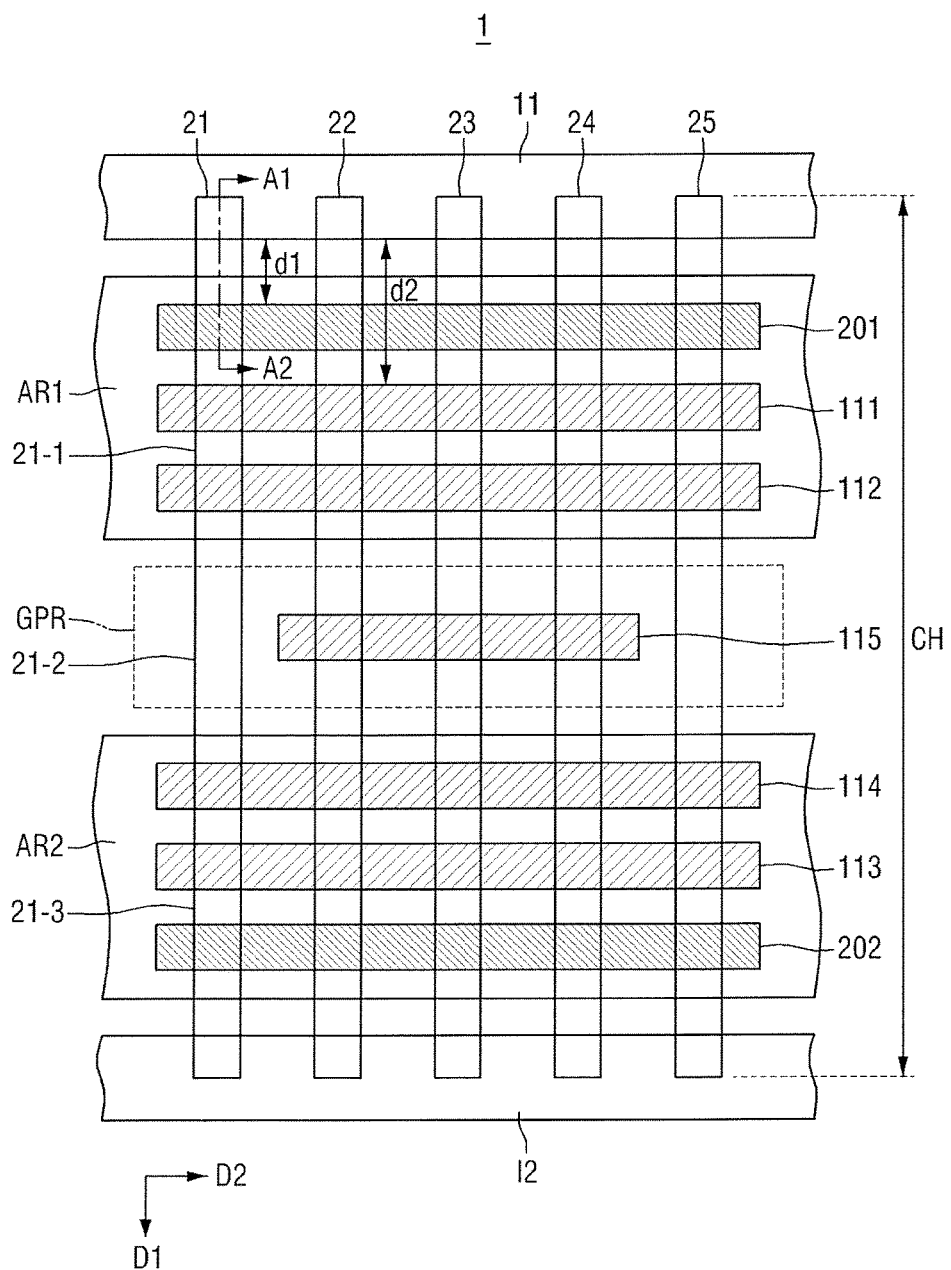
FIG. 3 is a layout view of a semiconductor device according to an exemplary embodiment of the present inventive concept.
Figure 4:
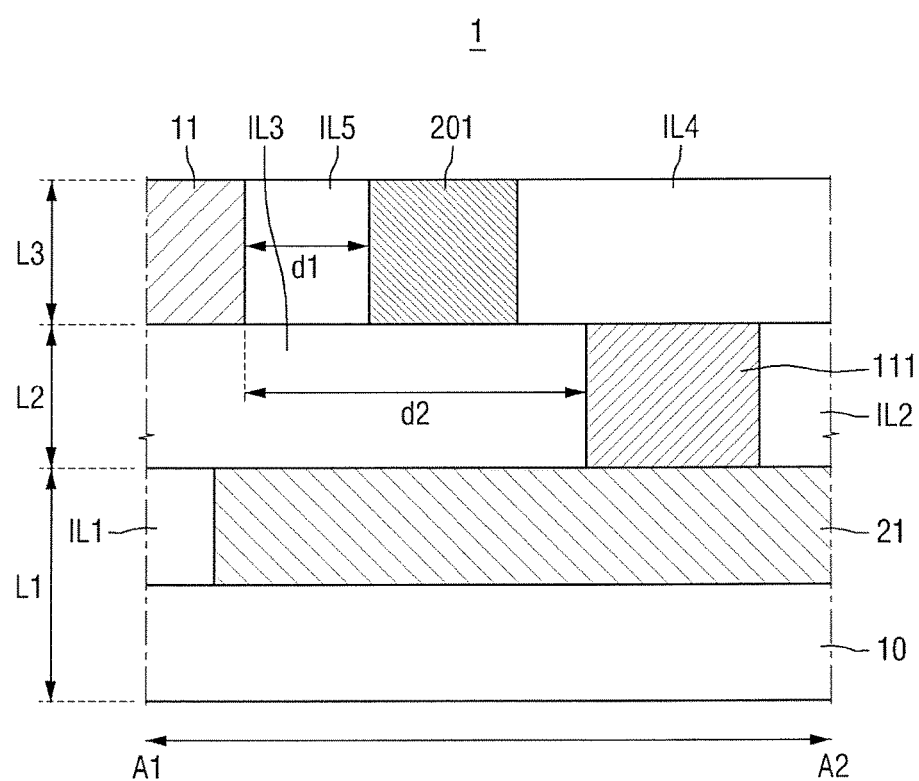
FIG. 4 is a cross-sectional view taken along the line A1-A2 of FIG. 3 according to an exemplary embodiment of the present inventive concept.

FIG. 3 is a layout view of a semiconductor device 1 according to an exemplary embodiment of the present inventive concept. FIG. 4 is a cross-sectional view taken along the line A1-A2 of FIG. 3 according to an exemplary embodiment of the present inventive concept.

Referring to FIGS. 3 and 4, the semiconductor device 1 includes a substrate 10, a first active region AR1, a second active region AR2, a gate pickup region GPR, a first power rail 11, a second power rail 12, first through fifth gate lines 21 through 25, and first through seventh metal interconnects 111 through 115, 201, and 202.

Each semiconductor device according to an exemplary embodiment of the present inventive concept which will be described below may operate as a planar transistor, a buried cell array transistor (BCAT), or a fin-type transistor using the above-described elements.

For example, the substrate 10 may be a semiconductor substrate. The substrate 10 may include silicon (Si), strained Si, Si alloy, silicon carbide (SiC), silicon germanium (SiGe), silicon germanium carbide (SiGeC), germanium (Ge), Ge alloy, gallium arsenide (GaAs), indium arsenide (InAs), III-V semiconductor, II-VI semiconductor, or the like, a combination thereof, or a stack thereof. In an exemplary embodiment of the present inventive concept, the substrate 10 may be an organic plastic substrate. Hereinafter, a case where the substrate 10 is made of silicon will be described.

The substrate 10 may be of a p type or an n type. In an exemplary embodiment of the present inventive concept, the substrate 10 may be an insulating substrate, for example, a silicon-on-insulator (SOI) substrate. When the SOI substrate is used as the substrate 10, an operational delay time of the semiconductor device 1 can be reduced.

The substrate 10 may include an active region. The active region may extend along a second direction DR2. For example, the substrate 10 may include a plurality of active regions. The active regions may be separated from each other in a first direction DR1 which intersects the second direction DR2. For example, the active regions may include the first active region AR1 and the second active region AR2. The second active region AR2 may be separated from the first active region AR1 in the first direction DR1. For example, the second active region AR2 may be disposed in parallel to the first active region AR1, but the present inventive concept is not limited thereto.

Each of the first active region AR1 and the second active region AR2 may be part of the substrate 10, or may include an epitaxial layer grown from the substrate 10. Each of the first active region AR1 and the second active region AR2 may include Si, SiGe, or the like. In addition, each of the first active region AR1 and the second active region AR2 may include n-type or p-type impurities.

The gate pickup region GPR may be formed between the first active region AR1 and the second active region AR2. The gate pickup region GPR may extend along the second direction DR2. A gate pickup insulating layer and a gate pickup electrode may be formed in the gate pickup region GPR. The gate pickup insulating layer may include silicon oxide. In addition, the gate pickup electrode may include a conductor such as doped polycrystalline silicon, or the like. For example, the gate pickup insulating layer may cover lower and side surfaces of the gate pickup electrode.

The first through fifth gate lines 21 through 25 may be formed on the first and second active regions AR1 and AR2. The first through fifth gate lines 21 through 25 may extend along the first direction DR1 to intersect the first and second active regions AR1 and AR2. The first through fifth gate lines 21 through 25 may be separated from each other in the second direction DR2. Here, the first through fifth gate lines 21 through 25 may be separated by a predetermined distance. In an exemplary embodiment of the present inventive concept, the number of gate lines formed in a semiconductor device may be different from the number of gate lines illustrated in FIG. 3.

Each of the first through fifth gate lines 21 through 25 may be made of a metal with high conductivity, but the present inventive concept is not limited thereto. In an exemplary embodiment of the present inventive concept, each of the first through fifth gate lines 21 through 25 can be made of a non-metal such as polysilicon, or the like. For example, the non-metal may be understood as a material that mostly lacks metallic attributes.

The first through fifth gate lines 21 through 25 may have substantially the same structure as each other, but the present inventive concept is not limited thereto. Hereinafter, only the first gate line 21 will be described based on the assumption that the first through fifth gate lines 21 through 25 have substantially the same structure as each other.

The first gate line 21 may extend along the first direction DR1 to overlap the first active region AR1, the gate pickup region GPR, and the second active region AR2. The first gate line 21 may include a first gate part 21_1 which overlaps the first active region AR1, a second gate part 21_2 which overlaps the gate pickup region GPR, and a third gate part 21_3 which overlaps the second active region AR2. The first through third gate parts 21_1 through 21_3 may be formed with each other in an integrated manner.

The first power rail 11 may be formed on a first end of each of the first through fifth gate lines 21 through 25 to overlap the first end of each of the first through fifth gate lines 21 through 25. The second power rail 12 may be formed on a second end of each of the first through fifth gate lines 21 through 25 to overlap the second end of each of the first through fifth gate lines 21 through 25. The first power rail 11 may extend along the second direction DR2. The second power rail 12 may extend along the second direction DR2 and may be separated from the first power rail 11 in the first direction DR1.

Referring to FIG. 3, a cell height CH of a standard cell may correspond to substantially a length of each of the first through fifth gate lines 21 through 25. Each of the first through fifth gate lines 21 through 25 are disposed on the first active region AR1, the gate pickup region GPR, and the second active region AR2 to overlap the first active region AR1, the gate pickup region GPR, and the second active region AR2. The standard cell may be disposed under the first power rail 11 and the second power rail 12. In the exemplary embodiment described with reference to FIG. 3, the standard cell may have seven tracks.

The semiconductor device 1 may include the first through seventh metal interconnects 111 through 115, 201, and 202 which are used for signal routing. The fifth metal interconnect 115 may be disposed on the gate pickup region GPR and electrically connected to the second through fourth gate lines 22 through 24. The first and second metal interconnects 111 and 112 may be disposed on and connected to the first active region AR1. The third and fourth metal interconnects 113 and 114 may be disposed on and connected to the second active region AR2.

The sixth metal interconnect 201 may be disposed closer to the first power rail 11 than the first through fifth metal interconnects 111 through 115. The sixth metal interconnect 201 may be disposed in a higher layer than the first through fifth metal interconnects 111 through 115. In addition, the seventh metal interconnect 202 may be disposed closer to the second power rail 12 than the first through fifth metal interconnects 111 through 115. The seventh metal interconnect 202 may be disposed in a higher layer than the first through fifth metal interconnects 111 through 115.

For example, referring to FIG. 4, a first layer L1 may include the substrate 10. The first gate line 21 and a first interlayer insulating film IL1 may be formed in the first layer L1. Each of the second through fifth gate lines 22 through 25 may be formed in the first layer L1.

The first interlayer insulating film IL1 may be used for electrical insulation between the first gate line 21 and the first power rail 11. The first interlayer insulating film IL1 may be made of silicon oxide such as borosilicate glass (BSG), phosphosilicate glass (PSG), borophosphosilicate glass (BPSG), updoped silicate glass (USG), tetraethylorthosilicate glass (TEOS), high density plasma-chemical vapor deposition (HDP-CVD), or the like. An upper surface of the first gate line 21 and an upper surface of the first interlayer insulating film IL1 may lie in the same plane as each other.

A second layer L2 may be formed on the first layer L1. The first metal interconnect 111, a second interlayer insulating film IL2, and a third interlayer insulating film IL3 may be formed in the second layer L2. Each of the second through fifth metal interconnects 112 through 115 may be formed in the second layer L2. For example, the first through fifth gate lines 21 through 25 may be formed in the first layer L1, and the first through fifth metal interconnects 111 through 115 may be formed in the second layer L2. Therefore, the first through fifth metal interconnects 111 through 115 may be formed in a higher layer than the first through fifth gate lines 21 through 25.

The second interlayer insulating film IL2 and the third interlayer insulating film IL3 may be used for electrical insulation between the first metal interconnect 111 and the sixth metal interconnect 201. Each of the second interlayer insulating film IL2 and the third interlayer insulating film IL3 may be made of silicon oxide such as BSG, PSG, BPSG, USG, TEOS, HDP-CVD, or the like. An upper surface of the first metal interconnect 111, an upper surface of the second interlayer insulating film IL2, and an upper surface of the third interlayer insulating film IL3 may lie in the same plane as each other.

A third layer L3 may be formed on the second layer L2. The first power rail 11, the sixth metal interconnect 201, a fourth interlayer insulating film IL4, and a fifth interlayer insulating film IL5 may be formed in the third layer L3. The second power rail 12 may be formed in the third layer L3. In addition, the seventh metal interconnect 202 may be formed in the third layer L3. For example, the first through fifth metal interconnects 111 through 115 may be formed in the second layer L2, and the sixth and seventh metal interconnects 201 and 202 may be formed in the third layer L3. Therefore, the sixth metal interconnect 201 and the seventh metal interconnect 202 may be formed in a higher layer than the first through fifth metal interconnects 111 through 115.

The sixth metal interconnect 201 is disposed adjacent to the first power rail 11, and the seventh metal interconnect 202 is disposed adjacent to the second power rail 12. Referring to FIG. 3, since the sixth metal interconnect 201 and the seventh metal interconnect 202 are disposed to be substantially symmetrical to each other with respect to the gate pickup region GPR, substantially the description given for the sixth metal interconnect 201 is applied to the seventh metal interconnect 202.

The sixth metal interconnect 201 is disposed in a higher layer than the first through fifth metal interconnects 111 through 115. Thus, even if a contact is formed at a first location of the first active region AR1 connected to each of the first through fifth metal interconnects 111 through 115 and the sixth metal interconnect 201 overlap the first location, the probability of a short circuit between the contact and the sixth metal interconnect 201 is reduced. For example, the probability of a short circuit between the first metal interconnect 111 and the sixth metal interconnect 201 may be reduced.

Due to the reduced probability of a short circuit between the first metal interconnect 111 and the sixth metal interconnect 201, the first metal interconnect 111 and the sixth metal interconnect 201 can be made of the same material as each other. For example, each of the first metal interconnect 111 and the sixth metal interconnect 201 can be made of copper (Cu). However, the present inventive concept is not limited thereto. In an exemplary embodiment of the present inventive concept, the first metal interconnect 111 can include tungsten (W), and the sixth metal interconnect 201 can include Cu.

The fourth interlayer insulating film IL4 and the fifth interlayer insulating film IL5 may be used for electrical insulation among the first metal interconnect 111, the sixth metal interconnect 201, and the first power rail 11. For example, the fifth interlayer insulating film IL5 may be used for electrical insulation between the first power rail 11 and the sixth metal interconnect 201. The fourth interlayer insulating film IL4 and the fifth interlayer insulating film IL5 may be made of silicon oxide such as BSG, PSG, BPSG, USG, TEOS, HDP-CVD, or the like. An upper surface of the first power rail 11, an upper surface of the sixth metal interconnect 201, an upper surface of the fourth interlayer insulating film IL4, and an upper surface of the fifth interlayer insulating film IL5 may lie in the same plane as each other.

According to an exemplary embodiment of the present inventive concept, the first power rail 11 may be a power supply voltage (VDD) rail, and the second power rail 12 may be a ground voltage (GND) rail. In this case, the first active region AR1 may include a p-type impurity region, and the second active region AR2 may include an n-type impurity region.

In addition, the first power rail 11 may be electrically connected to the sixth metal interconnect 201 to supply power to the semiconductor device 1. Therefore, a distance d1 between the sixth metal interconnect 201 and the first power rail 11 may be smaller than a distance d2 between the first metal interconnect 111 and the first power rail 11. In addition, a distance between each of the second through fifth metal interconnects 112 through 115 and the first power rail 11 may be greater than the horizontal distance d1 between the sixth metal interconnect 201 and the first power rail 11.

As described above, in the semiconductor device 1, the first through fifth metal interconnects 111 through 115 formed in the second layer L2 and the sixth and seventh metal interconnects 201 and 202 formed in the third layer L3 may be used for signal routing. Since the first through fifth metal interconnects 111 through 115 are formed in a different layer (e.g., the second layer L2) from a layer (e.g., the third layer L3) of the sixth and seventh metal interconnects 201 and 202, the first through fifth metal interconnects 111 through 115 can route signal paths in either direction of the first direction DR1 or the second direction DR2, regardless of routing directions in the sixth and seventh metal interconnects 201 and 202, and thus, routability of signal paths may be increased.

In addition, the sixth metal interconnect 201 and the seventh metal interconnect 202 can route signal paths in either direction of the first direction DR1 or the second direction DR2, regardless of routing directions in the first through fifth metal interconnects 111 through 115, and thus, routability of signal paths may be increased.

Hereinafter, a semiconductor device according to an exemplary embodiment of the present inventive concept will be described.

Figure 5:
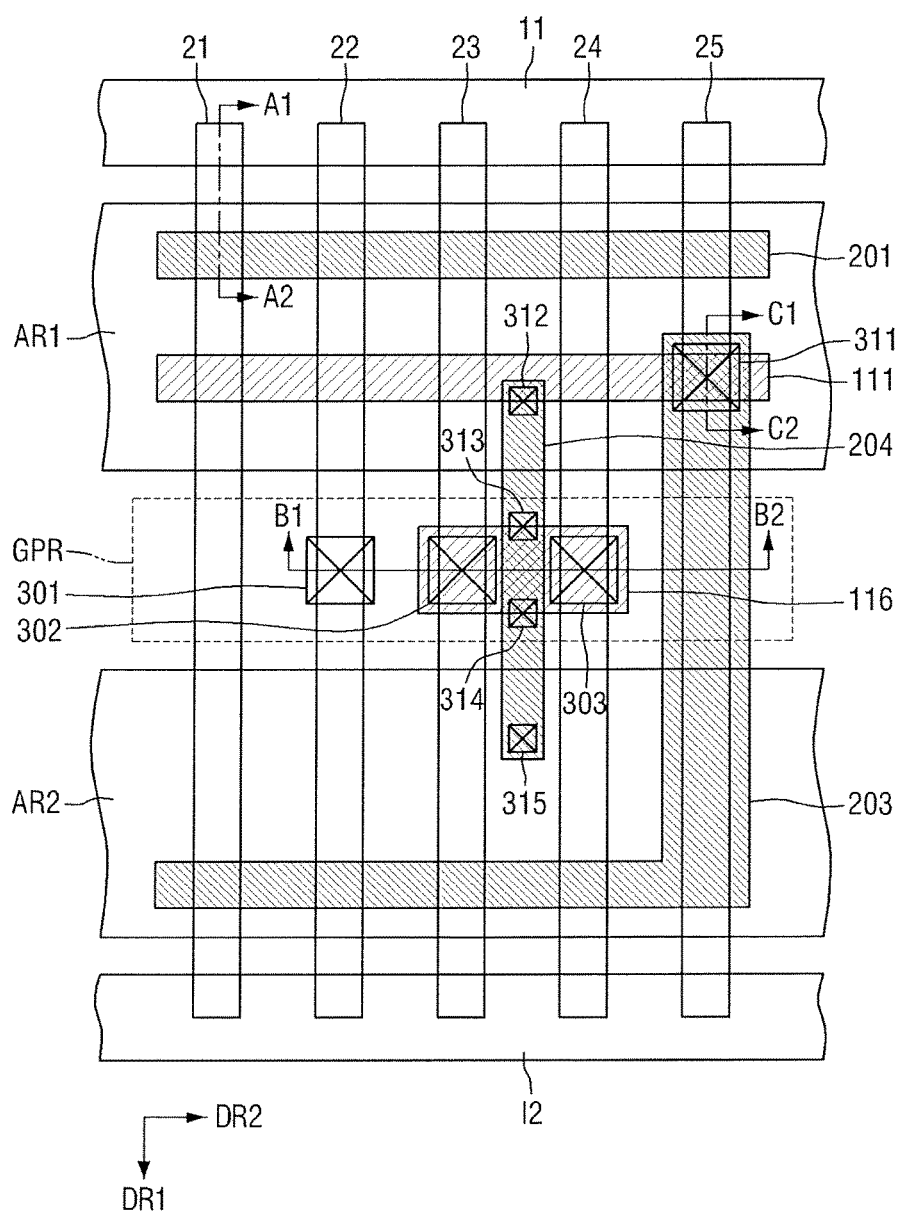
FIG. 5 is a layout view of a semiconductor device according to an exemplary embodiment of the present inventive concept.
Figure 6:
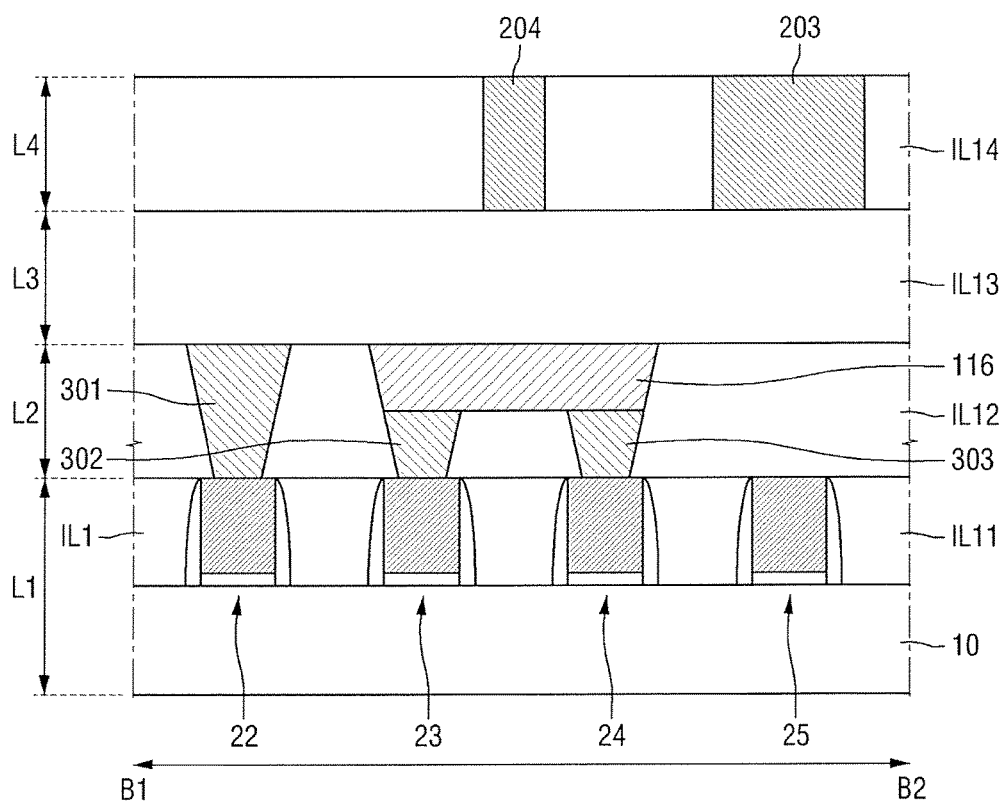
FIG. 6 is a cross-sectional view taken along the line B1-B2 of FIG. 5 according to an exemplary embodiment of the present inventive concept.
Figure 7:
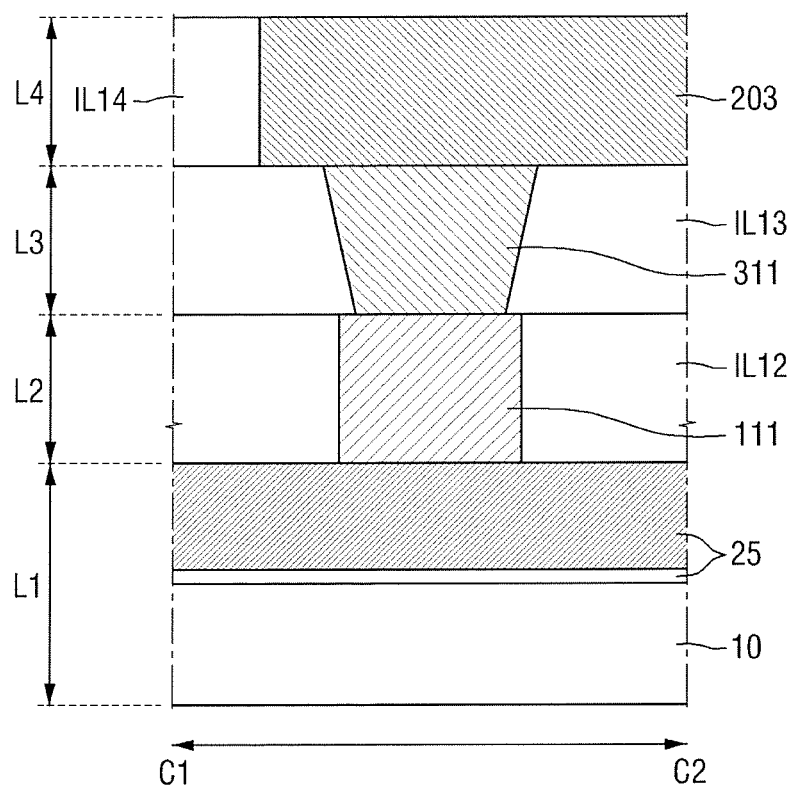
FIG. 7 is a cross-sectional view taken along the line C1-C2 of FIG. 5 according to an exemplary embodiment of the present inventive concept.

FIG. 5 is a layout view of a semiconductor device 2 according to an exemplary embodiment of the present inventive concept. FIG. 6 is a cross-sectional view taken along the line B1-B2 of FIG. 5 according to an exemplary embodiment of the present inventive concept. FIG. 7 is a cross-sectional view taken along the line C1-C2 of FIG. 5 according to an exemplary embodiment of the present inventive concept. For purpose of simplicity, description of elements substantially identical to those of the semiconductor device 1 of FIG. 3 will be omitted.

Referring to FIGS. 5 through 7, the semiconductor device 2 according to an exemplary embodiment of the present inventive concept includes a substrate 10, a first active region AR1, a second active region AR2, a gate pickup region GPR, a first power rail 11, a second power rail 12, first through fifth gate lines 21 through 25, a first metal interconnect 111, a sixth metal interconnect 201, an eighth metal interconnect 203, a ninth metal interconnect 204, first through third gate contacts 301 through 303, and first through fifth via contacts 311 through 315.

For example, the substrate 10 may be a semiconductor substrate. The substrate 10 may include Si, strained Si, Si alloy, SiC, SiGe, SiGeC, Ge, Ge alloy, GaAs, InAs, III-V semiconductor, II-VI semiconductor, or the like, a combination thereof, or a stack thereof. In an exemplary embodiment of the present inventive concept, the substrate 10 may be an organic plastic substrate.

The substrate 10 may be of a p type or an n type. In an exemplary embodiment of the present inventive concept, the substrate 10 may be an insulating substrate, for example, an SOI substrate. When the SOI substrate is used as the substrate 10, an operational delay time of the semiconductor device 2 can be reduced.

The substrate 10 may include an active region. The active region may extend along a second direction DR2. For example, the substrate may include a plurality of active regions. The active regions may be separated from each other in a first direction DR1 which intersects the second direction DR2. For example, the active regions may include the first active region AR1 and the second active region AR2. The second active region AR2 may be separated from the first active region AR1 in the first direction DR1. For example, the second active region AR2 may be disposed in parallel to the first active region AR1, but the present inventive concept is not limited thereto.

Each of the first active region AR1 and the second active region AR2 may be part of the substrate 10, or may include an epitaxial layer grown from the substrate 10. Each of the first active region AR1 and the second active region AR2 may include Si, SiGe, or the like. In addition, each of the first active region AR1 and the second active region AR2 may include n-type or p-type impurities.

The gate pickup region GPR may be formed between the first active region AR1 and the second active region AR2.

The gate pickup region GPR may extend along the second direction DR2. A gate pickup insulating layer and a gate pickup electrode may be formed in the gate pickup region GPR. The gate pickup insulating layer may include silicon oxide. In addition, the gate pickup electrode may include a conductor such as doped polycrystalline silicon, or the like. For example, the gate pickup insulating layer may cover lower and side surfaces of the gate pickup electrode.

The first through fifth gate lines 21 through 25 may be formed on the first and second active regions AR1 and AR2. The first through fifth gate lines 21 through 25 may extend along the first direction DR1 to intersect the first and second active regions AR1 and AR2. The first through fifth gate lines 21 through 25 may be separated from each other in the second direction DR2. Here, the first through fifth gate lines 21 through 25 may be separated by a predetermined distance.

The first through fifth gate lines 21 through 25 may be made of a metal with high conductivity, but the present inventive concept is not limited thereto. In an exemplary embodiment of the present inventive concept, the first through fifth gate lines 21 through 25 can be made of a non-metal such as polysilicon, or the like.

The first power rail 11 may be formed on a first end of each of the first through fifth gate lines 21 through 25 to overlap the first end of each of the first through fifth gate lines 21 through 25. The second power rail 12 may be formed on a second end of each of the first through fifth gate lines 21 through 25 to overlap the second end of each of the first through fifth gate lines 21 through 25. The first power rail 11 may extend along the second direction DR2. The second power rail 12 may extend along the second direction DR2 and may be separated from the first power rail 11 in the first direction DR1.

The semiconductor device 2 may include the first metal interconnect 111, the sixth metal connect 201, the eighth metal interconnect 203, and the ninth metal interconnect 204 which are used for signal routing.

The first metal interconnect 111 may be connected to a portion of the first active region AR1. The sixth metal interconnect 201 may be disposed closer to the first power rail 11 than the first metal interconnect 111. In addition, the sixth metal interconnect 201 may be disposed in a higher layer than the first metal interconnect 111. The eighth metal interconnect 203 may be 'L'-shaped and a portion of the eighth metal interconnect 203 may be disposed close to the second power rail 12. In addition, the eighth metal interconnect 203 may be disposed in a higher layer than the first metal interconnect 111.

The ninth metal interconnect 204 may overlap the first active region AR1, the gate pickup region GPR, and the second active region AR2. The ninth metal interconnect 204 may be disposed in a higher layer than the first metal interconnect 111.

For example, the eighth metal interconnect 203 may be electrically connected to the first metal interconnect 111 through the first via contact 311. In an exemplary embodiment of the present inventive concept, the eighth metal interconnect 203 may be designed to be electrically connected to another metal interconnect other than the first metal interconnect 111. For example, when the eighth metal interconnect 203 is electrically connected to the first metal interconnect 111, the first metal interconnect 111 and the eighth metal interconnect 203 can be used for signal routing.

Referring to FIGS. 6 and 7, the first gate contact 301 may be formed on the second gate line 22, the second gate contact 302 may be formed on the third gate line 23, and the third gate contact 303 may be formed on the fourth gate line 24. The second gate contact 302 and the third gate contact 303 may be electrically connected to each other through a connection line 116. Thus, signals can be transmitted to the third gate line 23 and the fourth gate line 24 through the connection line 116.

For example, referring to FIG. 6, a first layer L1 may include the substrate 10. The second through fifth gate lines 22 through 25 and an interlayer insulating film IL11 may be formed in the first layer L1. The interlayer insulating film IL1 may be used to insulate the second through fifth gate lines 22 through 25 from each other. An upper surface of each of the second through fifth gate lines 22 through 25 and an upper surface of the interlayer insulating film IL11 may lie in the same plane as each other.

A second layer L2 may be formed on the first layer L1. The first through third gate contacts 301 through 303, the connection line 116, and an interlayer insulating film IL12 may be formed in the second layer L2. In addition, the first metal interconnect 111 may be formed in the second layer L2. The interlayer insulating film IL12 may be used to insulate the first through third gate contacts 301 through 303 from each other. The second gate contact 302 and the third gate contact 303 may be electrically connected to each other through the connection line 116. An upper surface of the first gate contact 301, an upper surface of the connection line 116, and an upper surface of the interlayer insulating film IL12 may lie in the same plane as each other.

A third layer L3 may be formed on the second layer L2. The first via contact 311 and an interlayer insulating film IL13 may be formed in the third layer L3. The first via contact 311 electrically connects the first metal interconnect 111 and the eighth metal interconnect 203. An upper surface of the first via contact 311 and an upper surface of the interlayer insulating film IL13 may lie in the same plane as each other.

A fourth layer L4 may be formed on the third layer L3. The eighth metal interconnect 203, the ninth metal interconnect 204, and an interlayer insulating film IL14 may be formed in the fourth layer L4. Referring to FIG. 5, the second through fifth via contacts 312 through 315 are formed on the ninth metal interconnect 204. This may be understood to mean that four access pins may exist in the ninth metal interconnect 204.

For example, according to an exemplary embodiment of the present inventive concept, the sixth metal interconnect 201 and the eighth metal interconnect 203 are formed in a higher layer than the first metal interconnect 111, and thus, a semiconductor integrated circuit can be designed without a loss of tracks adjacent to the first power rail 11 and the second power rail 12. As described above, in the structure of the semiconductor device 2, a plurality of via contacts (e.g., the second through fifth via contacts 312 through 315) are formed on the ninth metal interconnect 204. Thus, a multi-access pin required for signal routing can be implemented using the via contacts. In addition, since the ninth metal interconnect 204 is formed in a higher layer than the first metal interconnect 111 and the connection line 116, the multi-access pin formed on the ninth metal interconnect 204 can be implemented without the risk of a short circuit between, e.g., the ninth metal interconnect 204 and each of the first metal interconnect 111 and the connection line 116.

In addition, since the third gate line 23 and the fourth gate line 24 are electrically connected to each other through the connection line 116, gates corresponding to the third gate line 23 and the fourth gate line 24 may be picked up at substantially the same time, for example, a multi-gate pickup may be achieved. Since the connection line 116 and the ninth metal interconnect 204 are formed in different layers from each other, a multi-gate pickup can be implemented. For example, a multi-gate pickup may be understood to mean that a plurality of gates operates as a whole.

The interlayer insulating films IL11 through IL14 may be made of silicon oxide such as BSG, PSG, BPSG, USG, TEOS, HDP-CVD, or the like.

Figure 8:
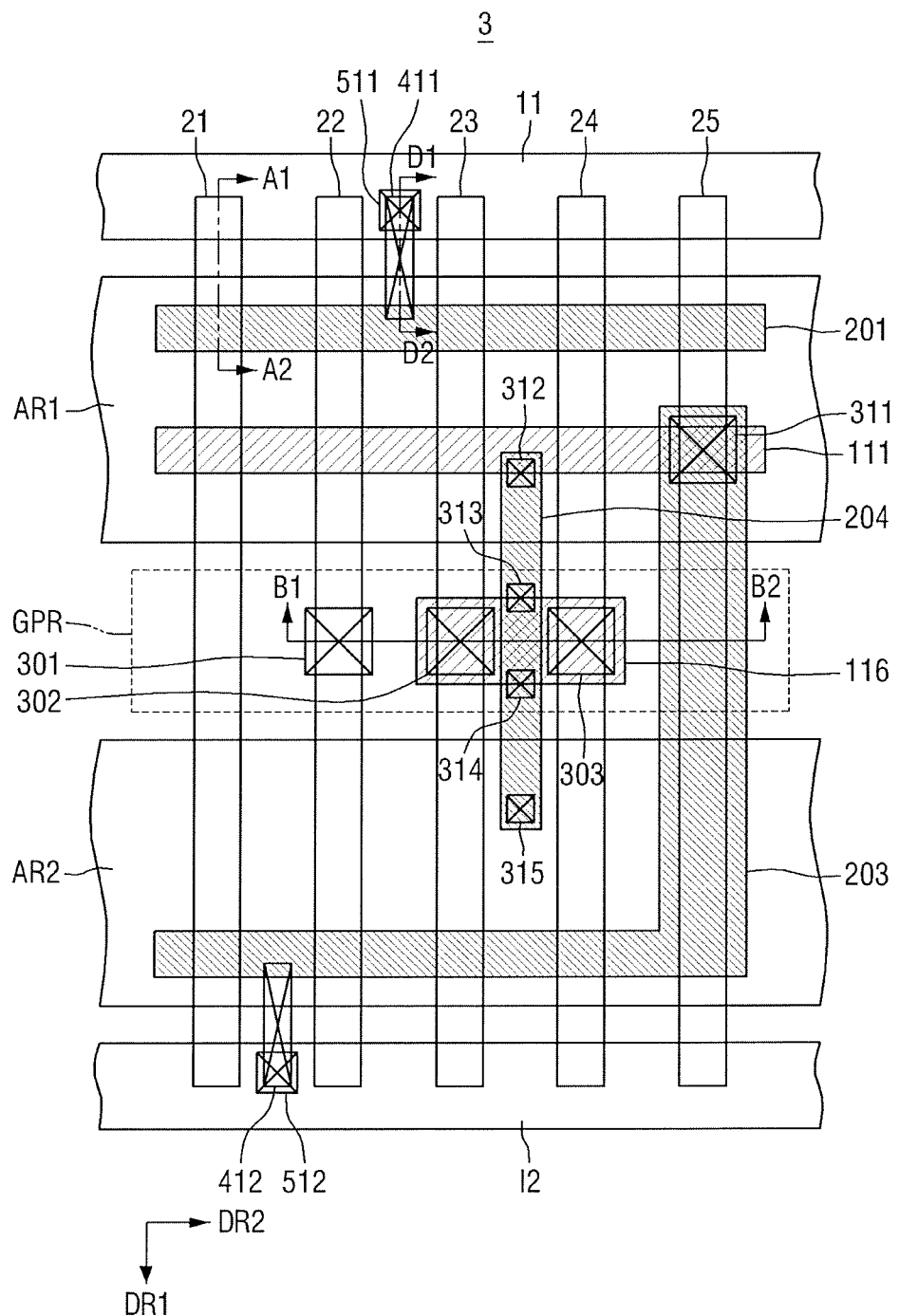
FIG. 8 is a layout view of a semiconductor device according to an exemplary embodiment of the present inventive concept.
Figure 9:
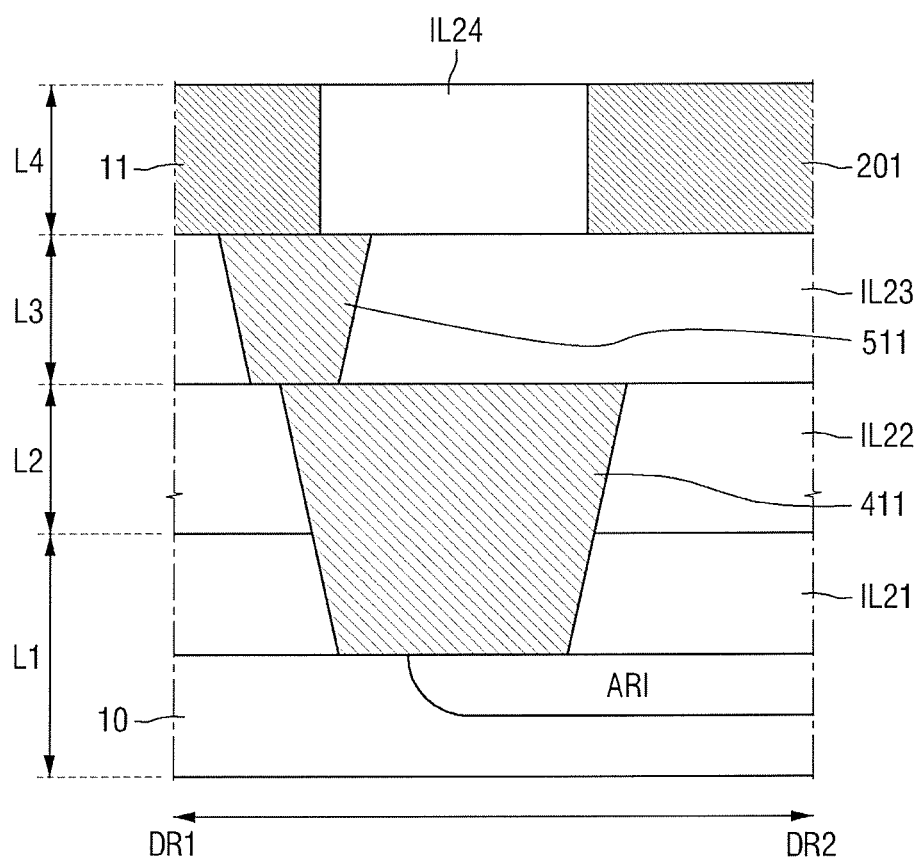
FIG. 9 is a cross-sectional view taken along the line D1-D2 of FIG. 8 according to an exemplary embodiment of the present inventive concept.

FIG. 8 is a layout view of a semiconductor device 3 according to an exemplary embodiment of the present inventive concept. FIG. 9 is a cross-sectional view taken along the line D1-D2 of FIG. 8 according to an exemplary embodiment of the present inventive concept. For purpose of simplicity, description of elements substantially identical to those of the semiconductor devices 1 and 2 of FIGS. 3 and 5 will be omitted.

Referring to FIGS. 8 and 9, the semiconductor device 3 according to an exemplary embodiment of the present inventive concept includes a substrate 10, a first active region AR1, a second active region AR2, a gate pickup region GPR, a first power rail 11, a second power rail 12, first through fifth gate lines 21 through 25, a first metal interconnect 111, a sixth metal interconnect 201, an eighth metal interconnect 203, a ninth metal interconnect 204, first through third gate contacts 301 through 303, first through fifth via contacts 311 through 315, first and second active contacts 411 and 412, a sixth via contact 511, and a seventh via contact 512.

The semiconductor device 3 of FIG. 8 has substantially identical structure and elements to those of the semiconductor device 2 of FIG. 5 except that the semiconductor device 3 further includes the first active contact 411, the second active contact 412, the sixth via contact 511, and the seventh via contact 512.

The first active contact 411 may overlap the first active region AR1 and the first power rail 11. The first active contact 411 may be electrically connected to the first power rail 11 through the sixth via contact 511, and the first active contact 411 may be electrically connected to a portion of the first active region AR1. Therefore, signals (e.g., power) transmitted through the first power rail 11 can be applied to the first active region AR1. Here, the sixth metal interconnect 201 is formed in a higher layer than the first active contact 411, and thus, space constraints in forming the first active contact 411 can be reduced and a short circuit between the sixth metal interconnect 201 and the first active contact 411 can be prevented.

The second active contact 412 may have substantially the same structure as the first active contact 411. The second active contact 412 may be electrically connected to the second power rail 12 through the seventh via contact 512, and the second active contact 412 may be electrically connected to a portion of the second active region AR2.

Interlayer insulating films IL21 through IL24 may be made of silicon oxide such as BSG, PSG, BPSG, USG, TEOS, HDP-CVD, or the like.

Figure 10:
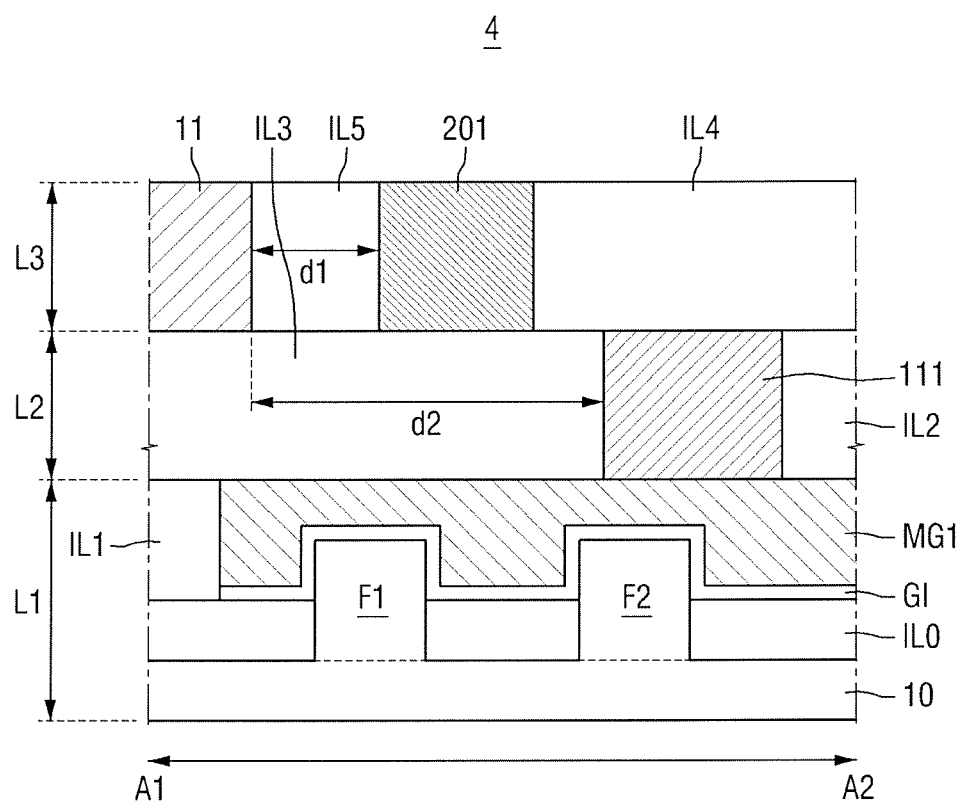
FIG. 10 is a cross-sectional view of a semiconductor device according to an exemplary embodiment of the present inventive concept.

FIG. 10 is a cross-sectional view of a semiconductor device 4 according to an exemplary embodiment of the present inventive concept. Although a layout view of the semiconductor device 4 is not illustrated for purpose of simplicity, the semiconductor device 4 has substantially the same structure and elements as those of each of the semiconductor devices 1 through 3 of FIGS. 3, 5, and 8, except for differences in the cross-sectional view taken along the line A1-A2 of each of FIGS. 3, 5, and 8. Description of elements substantially identical to those of the semiconductor devices 1 through 3 will be omitted.

Referring to FIG. 10, the semiconductor device 4 may include first and second fins F1 and F2 which protrude upward from a substrate 10. The first and second fins F1 and F2 may protrude upward from a first active region AR1. The semiconductor device 4 may further include a device isolation layer IL0 which covers the substrate 10 and part of sidewalls of each of the first and second fins F1 and F2.

The first fin F1 and the second fin F2 may protrude upward from the first active region AR1 of the substrate 10. The first fin F1 and the second fin F2 may be formed substantially parallel to each other.

In an exemplary embodiment of the present inventive concept, the first and second fins F1 and F2 may be made of substantially the same material as the substrate 10. For example, if the substrate 10 is made of Si, the first and second fins F1 and F2 may be made of Si. However, the present inventive concept is not limited thereto. In an exemplary embodiment of the present inventive concept, the first and second fins F1 and F2 may be made of different materials from the substrate 10. In an exemplary embodiment of the present inventive concept, the first and second fins F1 and F2 may be formed by partially etching the substrate 10, but the present inventive concept is not limited thereto.

In an exemplary embodiment of the present inventive concept, a cross-sectional shape of each of the first and second fins F1 and F2 may be a tapered shape (e.g., a shape which becomes wider in a direction from the bottom toward the top) or a chamfered shape, for example, corners of each of the first and second fins F1 and F2 are rounded in the chamfered shape.

The device isolation layer IL0 may be formed on side surfaces of the first and second fins F1 and F2 and on an upper surface of the substrate 10. The device isolation layer IL0 may have, but not limited to, a shallow trench isolation (STI) structure. The shallow trench isolation (STI) structure may facilitate high-density integration since it has relatively high isolation characteristics among devices and occupies a relatively small area. The device isolation layer IL0 may include at least silicon oxide, silicon nitride, silicon oxynitride, or the like, or any combination thereof.

A gate insulating layer GI may be conformally formed on the first and second fins F1 and F2 and the device isolation layer IL0. The gate insulating layer GI may include a high-k dielectric material having a higher dielectric constant than a silicon oxide layer. For example, the gate insulating layer GI may include a material such as $HfO_2$, $ZrO_2$, $Ta_2O_5$, $TiO_2$, $SrTiO_3$, $(Ba, Sr)TiO_3$, or the like The gate insulating layer GI may be formed to have an appropriate thickness according to the type of device to be formed.

A first metal gate MG1 may be formed on the gate insulating layer GI. For example, the first through fifth gate lines 21 through 25 described above with reference to FIG. 3 can be replaced by first through fifth metal gates MG1 through MG5.

A space among the first through fifth metal gates MG1 through MG5 may be filled with a first interlayer insulating film IL1. The first interlayer insulating film IL1 may electrically insulate the first through fifth metal gates MG1 through MG5 from each other. The first interlayer insulating film IL1 may be made of silicon oxide such as BSG, PSG, BPSG, USG, TEOS, HDP-CVD, or the like. An upper surface of each of the first through fifth metal gates MG1 through MG5 and an upper surface of the first interlayer insulating film IL1 may lie in the same plane as each other.

Figure 11:
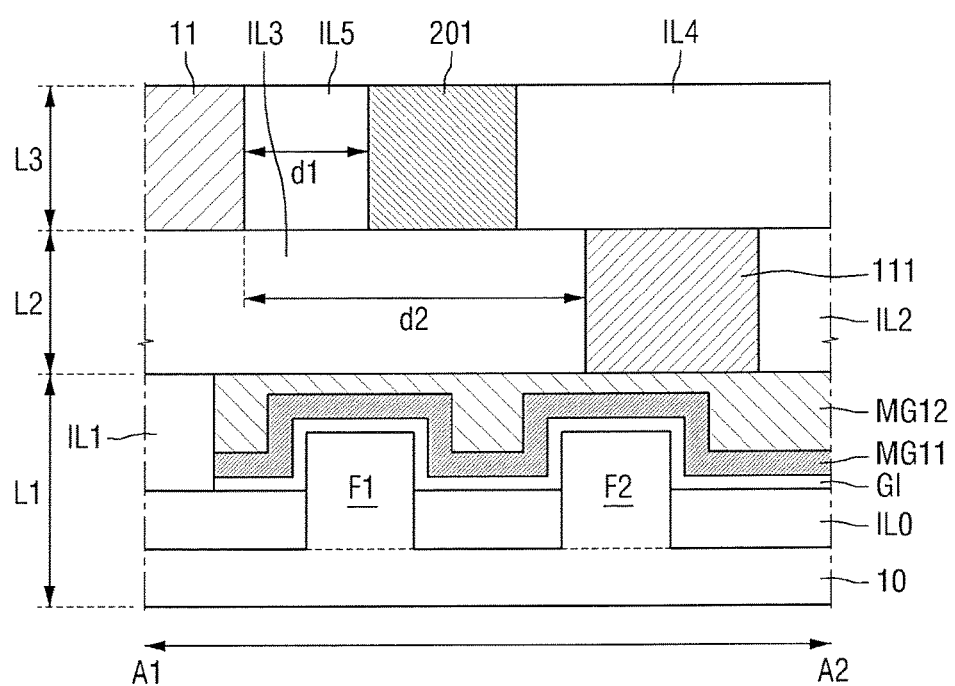
FIG. 11 is a cross-sectional view of a semiconductor device according to an exemplary embodiment of the present inventive concept.

FIG. 11 is a cross-sectional view of a semiconductor device 5 according to an exemplary embodiment of the present inventive concept. Although a layout view of the semiconductor device 5 is not illustrated for purpose of simplicity, the semiconductor device 5 has substantially the same structure and elements as those of each of the semiconductor devices 1 through 3 of FIGS. 3, 5, and 8, except for differences in the cross-sectional view taken along the line A1-A2 of each of FIGS. 3, 5, and 8. Description of elements substantially identical to those of the semiconductor devices 1 through 4 will be omitted.

Referring to FIG. 11, a first gate line 21 of the semiconductor device 5 may include first and second metal layers MG11 and MG12. Each of the second through fifth gate lines 22 through 25 in the semiconductor device 5 may include metal layers (e.g., MG11 and MG12). For example, each of the first through fifth gate lines 21 through 25 may be formed by stacking two or more metal layers (e.g., MG11 and MG12) on each other. The first metal layer MG11 may control a work function, and the second metal layer MG12 may fill a space formed by the first metal layer MG11 which is a gate electrode.

For example, the first metal layer MG11 may include TiN, TaN, TiC, TaC, or the like, and the second metal layer MG12 may include W, Al, or the like. In an exemplary embodiment of the present inventive concept, each of the first through fifth gate lines 21 through 25 may be made of a material (e.g., Si or SiGe) other than a metal. Each of the first through fifth gate lines 21 through 25 may be formed by, but not limited to, a replacement process.

A gate insulating layer GI may be formed between the first metal layer MG11 and each of first and second fins F1 and F2. The gate insulating layer GI may be formed on upper and side surfaces of each of the first and second fins F1 and F2. In addition, the gate insulating layer GI may be disposed between the first metal layer MG11 and a device isolation layer IL0. The gate insulating layer GI may include a high-k dielectric material having a higher dielectric constant than a silicon oxide layer. For example, the gate insulating layer GI may include $HfO_2$, $ZrO_2$, $Ta_2O_5$, or the like.

Source or drain regions may be formed on both sides of each of the first through fifth gate lines 21 through 25 and on each of the first fin F1 and the second fin F2. The source or drain regions may be elevated source or drain regions. Each of the elevated source or drain regions may have various shapes. For example, each of the elevated source or drain regions may have a diamond shape, a circular shape, a rectangular shape, or the like.

Figure 12:
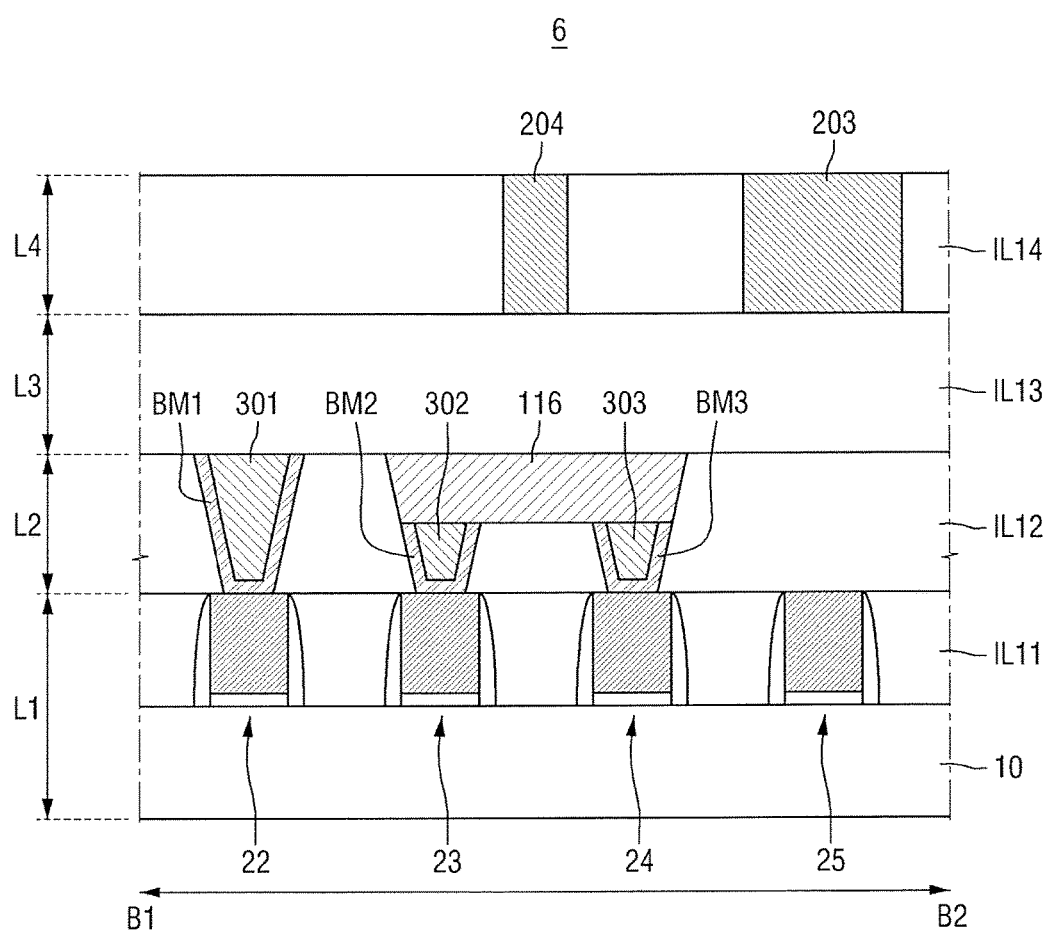
FIG. 12 is a cross-sectional view of a semiconductor device according to an exemplary embodiment of the present inventive concept.

FIG. 12 is a cross-sectional view of a semiconductor device 6 according to an exemplary embodiment of the present inventive concept. Although a layout view of the semiconductor device 6 is not illustrated for purpose of simplicity, the semiconductor device 6 has substantially the same structure and elements as those of each of the semiconductor devices 2 and 3 of FIGS. 5 and 8, except for differences in the cross-sectional view taken along the line B1-B2 of each of FIGS. 5 and 8. Description of elements substantially identical to those of the semiconductor devices 1 through 5 will be omitted.

Referring to FIG. 12, a plurality of trenches may be formed in an interlayer insulating film IL12 of the semiconductor device 6. Each of barrier metals BM1 through BM3 may be conformally formed on inner surfaces of each of the trenches. For example, each of the barrier metals BM1 through BM may be formed on both side surfaces and a lower surface of a corresponding trench to have a predetermined thickness. In an exemplary embodiment of the present inventive concept, each of the barrier metals BM1 through BM may be formed only on the lower surface of the corresponding trench to have a predetermined thickness. Each of the barrier metals BM1 through BM3 may include titanium (Ti), titanium nitride (TiN), tungsten nitride (WN), or the like. The barrier metals BM1 through BM3 may be formed by, but not limited to, physical vapor deposition (PVD), chemical vapor deposition (CVD), interlayer dielectric (ILD) deposition, or the like.

Each of gate contacts 301 through 303 may be formed on a corresponding one of the barrier metals BM1 through BM. Each of the gate contacts 301 through 303 may include a conductive material. For example, each of the gate contacts 301 through 303 may include metal or polysilicon. In addition, each of the gate contacts 301 through 303 may have a tapered cross-sectional shape which becomes wider in a direction from the bottom toward the top. However, the cross-sectional shape of each of the gate contacts 301 through 303 is not limited to the tapered shape. In an exemplary embodiment of the present inventive concept, the cross-sectional shape of each of the gate contacts 301 through 303 may be a quadrilateral shape. In an exemplary embodiment of the present inventive concept, the cross-sectional shape of each of the gate contacts 301 through 303 may be a chamfered shape, for example, corners of each of the gate contacts 301 through 303 may be rounded in the chamfered shape.

The gate contacts 301 through 303 will later be selectively connected to one another by using an interconnect structure which includes a metal and a via, such that the semiconductor device according to an exemplary embodiment of the present inventive concept can function as one logic cell.

As design rules for fabricating a semiconductor device become decrease, possibility of a short circuit may be increased. To prevent the short circuit, patterning may be performed by taking into consideration uniformity of critical dimensions, line edge roughness (LER) of patterns, and an overlay term for securing a margin to cope with a wrong pattern formation. Thus, a semiconductor device according to an exemplary embodiment of the present inventive concept can secure a track margin and reduce a short circuit using metal interconnects disposed in different layers, and thus, reliability thereof can be increased.

Figure 13:
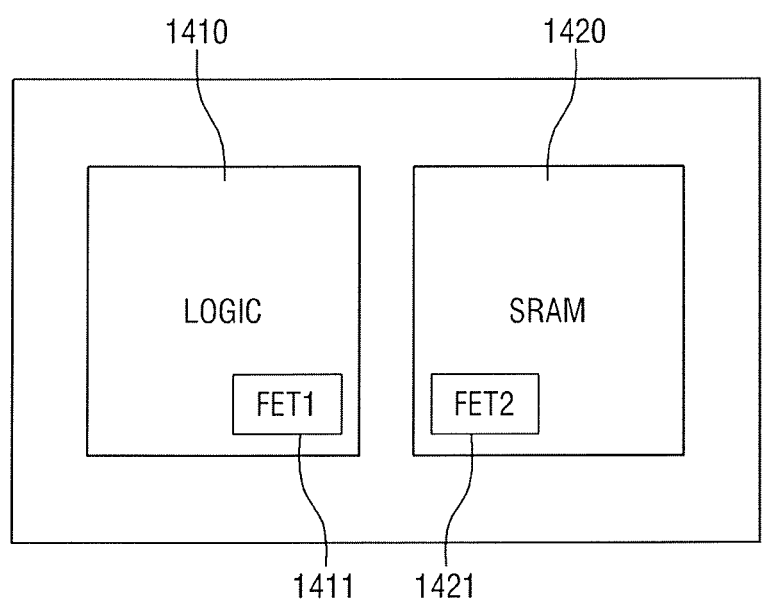
FIG. 13 is a block diagram of a semiconductor device according to an exemplary embodiment of the present inventive concept.
Figure 14:
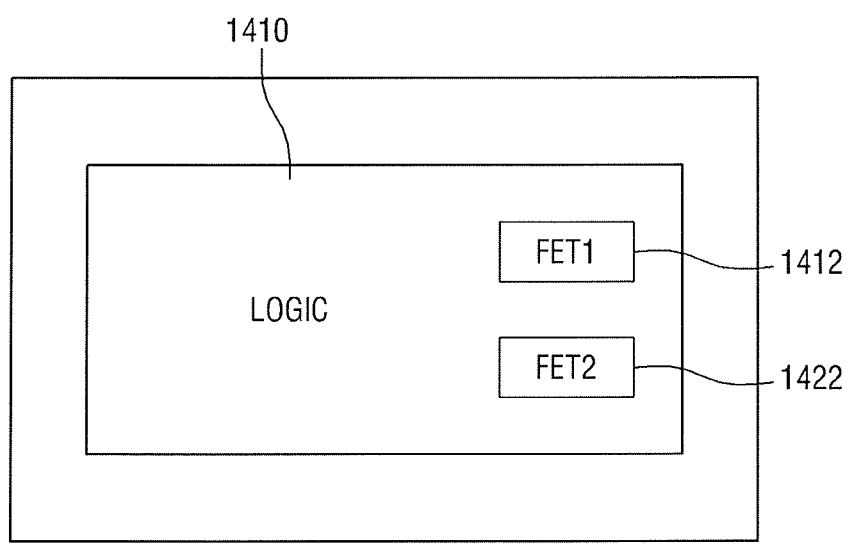
FIG. 14 is a block diagram of a semiconductor device according to an exemplary embodiment of the present inventive concept.

FIG. 13 is a block diagram of a semiconductor device 7 according to an exemplary embodiment of the present inventive concept. FIG. 14 is a block diagram of a semiconductor device 8 according to an exemplary embodiment of the present inventive concept. For purpose of simplicity, description of elements substantially identical to those of the semiconductors 1 through 6 will be omitted.

Referring to FIG. 13, the semiconductor device 7 may include a logic region 1410 and a static random access memory (SRAM) region 1420. A first transistor 1411 may be disposed in the logic region 1410, and a second transistor 1421 may be disposed in the SRAM region 1420.

In an exemplary embodiment of the present inventive concept, the first transistor 1411 and the second transistor 1421 may have different conductivity types from each other. In an exemplary embodiment of the present inventive concept, the first transistor 1411 and the second transistor 1421 may have the same conductivity type as each other. The semiconductor device 7 may include at least one of the semiconductor devices 1 through 6.

Referring to FIG. 14, the semiconductor device 8 may include a logic region 1410. Third and fourth transistors 1412 and 1422 which are different from each other may be disposed in the logic region 1410. Although not illustrated in the drawing, the semiconductor device 8 may further include an SRAM region, and the third and fourth transistors 1412 and 1422 may be disposed in the SRAM region.

In an exemplary embodiment of the present inventive concept, the third transistor 1412 and the fourth transistor 1422 may have different conductivity types from each other. In an exemplary embodiment of the present inventive concept, the third transistor 1412 and the fourth transistor 1422 may have the same conductivity type from each other. The semiconductor device 8 may include at least one of the semiconductor devices 1 through 6.

While it is described with reference to FIG. 14 that the semiconductor device 8 includes the logic region 1410 and the SRAM region, and each of the logic region 1410 and the SRAM region includes the transistors 1412 and 1422, the present inventive concept is not limited thereto. The present inventive concept is applicable to the logic region 1410 and a region where another memory (e.g., DRAM, MRAM, RRAM, PRAM, etc.) is formed. For example, each of the logic region 1410 and the region where the memory (e.g., DRAM, MRAM, RRAM, PRAM, etc.) may include the transistors 1412 and 1422.

Figure 15:
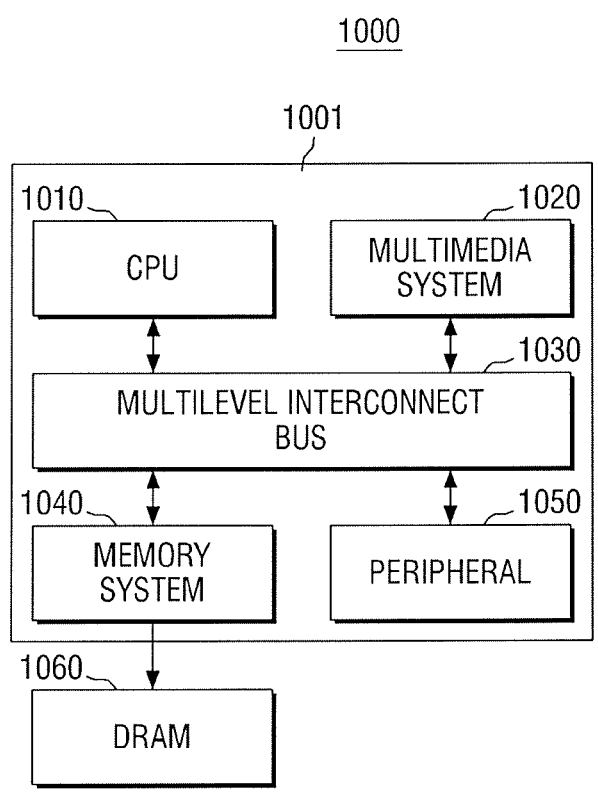
FIG. 15 is a block diagram of a system-on-chip (SoC) system including a semiconductor device according to an exemplary embodiment of the present inventive concept.

FIG. 15 is a block diagram of a system-on-chip (SoC) system 1000 including a semiconductor device according to an exemplary embodiment of the present inventive concept.

Referring to FIG. 15, the SoC system 1000 includes an application processor 1001 and a dynamic random access memory (DRAM) 1060.

The application processor 1001 may include a central processing unit (CPU) 1010, a multimedia system 1020, a bus 1030, a memory system 1040, and a peripheral circuit 1050.

The CPU 1010 may perform operations for driving the SoC system 1000. In an exemplary embodiment of the present inventive concept, the CPU 1010 may be configured to include a plurality of cores and operate in a multi-core environment.

The multimedia system 1020 may perform various multimedia functions in the SoC system 1000. The multimedia system 1020 may include a three-dimensional (3D) engine module, a video codec, a display system, a camera system, and a post-processor.

The bus 1030 may be used for data communication among the CPU 1010, the multimedia system 1020, the memory system 1040, and the peripheral circuit 1050. In an exemplary embodiment of the present inventive concept, the bus 1030 may have a multilayer structure. For example, the bus 1030 may be, but is not limited to, a multilayer advanced high-performance bus (AHB), a multilayer advanced extensible interface (AXI), or the like.

The memory system 1040 may provide an environment needed for the application processor 1001 to be connected to an external memory (e.g., the DRAM 1060) and operate at a high speed. In an exemplary embodiment of the present inventive concept, the memory system 1040 may include a controller (e.g., a DRAM controller) for controlling the external memory (e.g., the DRAM 1060).

The peripheral circuit 1050 may provide an environment needed for the SoC system 1000 to connect to an external device (e.g., a mainboard). To this end, the peripheral circuit 1050 may include various interfaces that adapt the external device connected to the SoC system 1000 to be compatible with the SoC system 1000.

The DRAM 1060 may function as an operating memory for the operation of the application processor 1001. In an exemplary embodiment of the present inventive concept, the DRAM 1060 may be placed outside the application processor 1001 as illustrated in FIG. 15. For example, the DRAM 1060 may be packaged with the application processor 1001 in the form of package on package (PoP).

At least one of the elements of the SoC system 1000 may employ at least one of the semiconductor devices 1 through 6.

Figure 16:
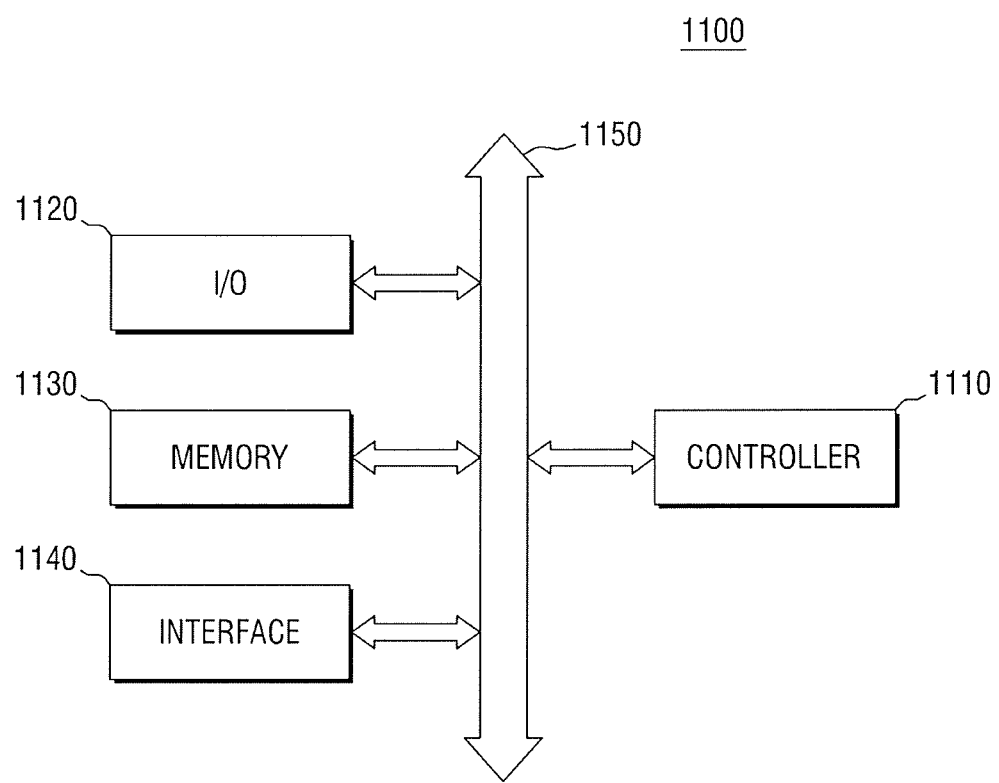
FIG. 16 is a block diagram of an electronic system including a semiconductor device according to an exemplary embodiment of the present inventive concept.

FIG. 16 is a block diagram of an electronic system 1100 including a semiconductor device according to an exemplary embodiment of the present inventive concept.

Referring to FIG. 16, the electronic system 1100 may include a controller 1110, an input/output (I/O) device 1120, a memory device 1130, an interface 1140, and a bus 1150.

The controller 1110, the I/O device 1120, the memory device 1130, and/or the interface 1140 may be connected to one another through the bus 1150. The bus 1150 may serve as a path for transmitting data.

The controller 1110 may include a microprocessor, a digital signal processor, a microcontroller, and/or logic devices that can perform similar functions to those of the microprocessor, the digital signal processor, and the microcontroller. The I/O device 1120 may include a keypad, a keyboard, and a display device. The memory device 1130 may store data and/or commands. The interface 1140 may be used to transmit data to or receive data from a communication network. The interface 1140 may be a wired or wireless interface. In an exemplary embodiment of the present inventive concept, the interface 1140 may include an antenna, a wired transceiver, or a wireless transceiver.

The electronic system 1100 may be a working memory for the operation of the controller 1110. The electronic system 1100 may further include a high-speed DRAM or SRAM. Here, each of the semiconductor devices 1 through 6 may be employed as the working memory. In addition, each of the semiconductor devices 1 through 6 may be provided in the memory device 1130, the controller 1110, or the I/O device 1120.

The electronic system 1100 may be applied to electronic products capable of transmitting and/or receiving information in a wireless environment, such as a personal data assistant (PDA), a portable computer, a web tablet, a wireless phone, a mobile phone, a digital music player, a memory card, etc.

Figure 17:
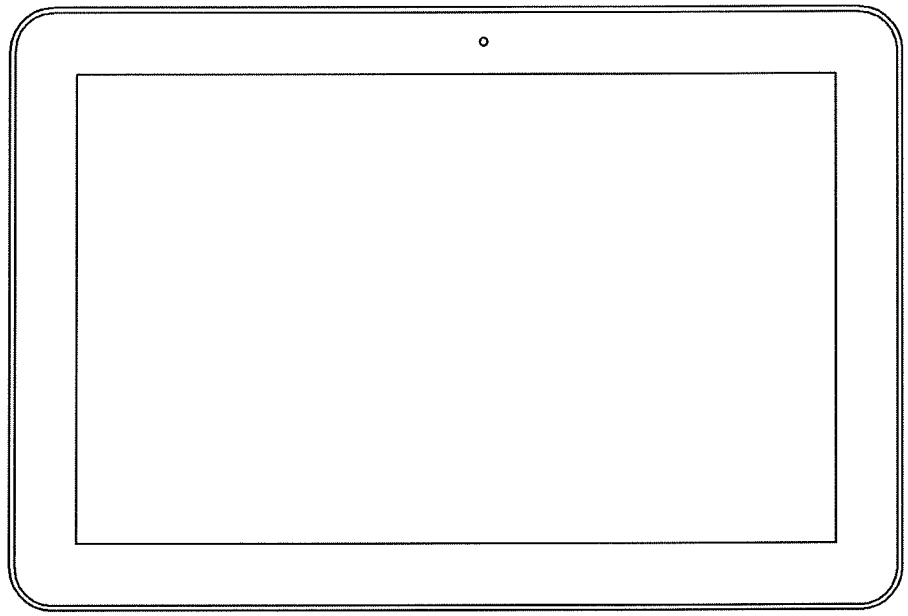
FIGS. 17 through 19 are diagrams illustrating examples of a semiconductor system to which a semiconductor device according to an exemplary embodiment of the present inventive concept can be applied.
Figure 18:
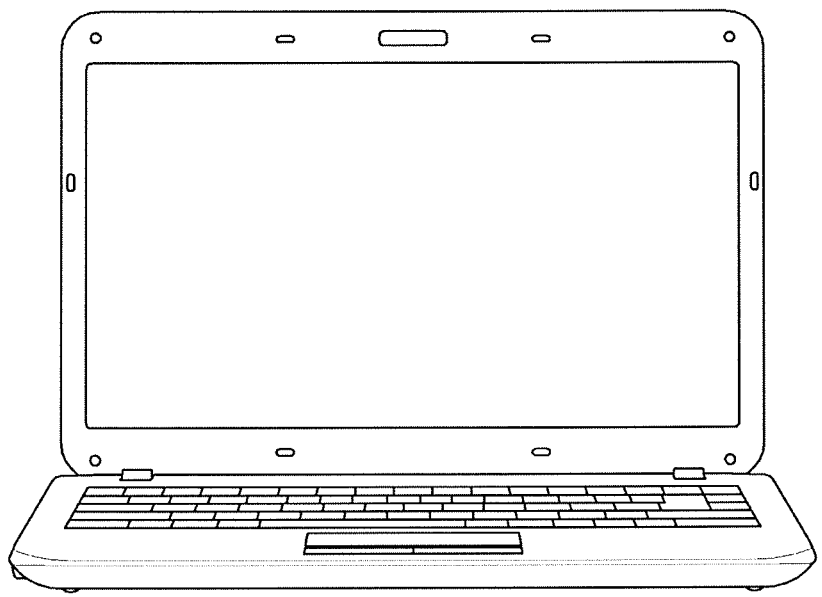
Figure 19:
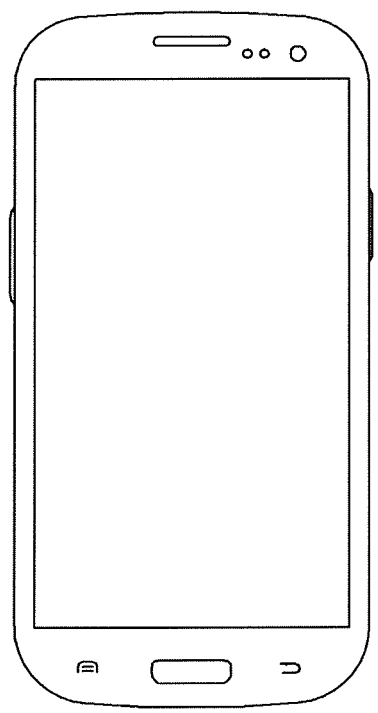

FIGS. 17 through 19 are diagrams illustrating examples of a semiconductor system to which a semiconductor device according to an exemplary embodiment of the present inventive concept can be applied.

FIG. 17 illustrates a tablet personal computer (PC) 1200, FIG. 18 illustrates a notebook computer 1300, and FIG. 19 illustrates a smartphone 1400. At least one of the semiconductor devices 1 through 6 may be used in the tablet PC 1200, the notebook computer 1300, and the smartphone 1400.

However, the present inventive concept is not limited thereto. At least one of the semiconductor devices 1 through 6 may be used in various IC devices other than the tablet PC 1200, the notebook computer 1300, and the smartphone 1400 illustrated in FIGS. 17 through 19. In an exemplary embodiment of the present inventive concept, the semiconductor system may be a computer, an ultra mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3D television set, a digital audio recorder, a digital audio player, a digital picture recorder, a digital picture player, a digital video recorder, a digital video player, etc.

While the present inventive concept has been particularly shown and described with reference to exemplary embodiments thereof, it will be understood that various changes in form and details may be made therein without departing from the spirit and scope of the present inventive concept as defined by the following claims.

What is claimed is:

1. A semiconductor device comprising:
    an active region;
    a gate line which overlaps the active region and extends along a first direction;
    a first metal interconnect which overlaps the active region and the gate line, the first metal interconnect extending along a second direction intersecting the first direction, wherein a first surface of the first metal interconnect directly contacts a first surface of the gate line such that a layer or an element is not disposed between the first surface of the first metal interconnect and the first surface of the gate line;
    a power rail disposed in a higher layer than the first metal interconnect, the power rail extending along the second direction; and
    a second metal interconnect disposed in a same layer as the power rail, the second metal interconnect extending along the second direction.

2. The semiconductor device of claim 1, wherein the gate line is disposed in a first layer, the first metal interconnect is disposed in a second layer, and the second metal interconnect is disposed in a third layer,
    wherein the second layer is disposed on the first layer, and the third layer is disposed on the second layer.

3. The semiconductor device of claim 1, wherein the power rail overlaps an end of the gate line.

4. The semiconductor device of claim 1, wherein a first distance between the second metal interconnect and the power rail in the first direction is smaller than a second distance between the first metal interconnect and the power rail in the first direction.

5. The semiconductor device of claim 4, wherein the first metal interconnect comprises a plurality of metal interconnects, wherein the plurality of metal interconnects are separated from the power rail in the first direction by a distance greater than the first distance.

6. The semiconductor device of claim 1, wherein the active region comprises a first active region and a second active region separated from the first active region in the first direction, and a gate pickup region is disposed between the first active region and the second active region.

7. The semiconductor device of claim 6, wherein the gate line comprises a first gate part which overlaps the first active region, a second gate part which overlaps the gate pickup region, and a third gate part which overlaps the second active region.

8. The semiconductor device of claim 7, wherein the first metal interconnect comprises a plurality of metal interconnects, wherein at least one of the plurality of metal interconnects overlaps the second gate part.

9. The semiconductor device of claim 1, further comprising a fast contact formed on the active region,
    wherein the first contact overlaps the second metal interconnect,
    wherein the first contact is disposed in a lower layer than the second metal interconnect.

10. The semiconductor device of claim 9, further comprising a second contact formed on the gate line,
    wherein the second contact is disposed in a lower layer than the second metal interconnect.

11. The semiconductor device of claim 10, wherein the first contact and the second contact are disposed in a same layer as each other.

12. A semiconductor device comprising:
    a first layer including an active region;
    a gate line formed in the first layer;
    a second layer disposed on the first layer;
    a first metal interconnect formed in the second layer, the first metal interconnect overlapping the active region, wherein a first surface of the first metal interconnect directly contacts a first surface of the gate line such that a layer or an element is not disposed between the first surface of the first metal interconnect and the first surface of the gate line;
    a third layer disposed on the second layer;
    a second metal interconnect formed in the third layer, wherein the second metal interconnect overlaps the active region, and the second metal interconnect does not overlap the first metal interconnect; and
    a power rail formed in the third layer, wherein the power rail does not overlap the active region, and the power rail is electrically connected to the second metal interconnect to supply power to the second metal interconnect,
    wherein an upper surface of the first metal interconnect lies in a same plane as a lower surface of the second metal interconnect and a lower surface of the power rail.

13. The semiconductor device of claim 12, further comprising a first contact formed on the active region and a second contact formed on the gate line.

14. The semiconductor device of claim 13, wherein the first and second contacts are formed in the second layer.

15. The semiconductor device of claim 12, wherein a first distance between the second metal interconnect and the power rail is smaller than a second distance between the first metal interconnect and the power rail.

16. The semiconductor device of claim 1, wherein an upper surface of the first metal interconnect lies in a same plane as a lower surface of the second metal interconnect and a lower surface of the power rail.

* * * * *